United States Patent
Park et al.

(10) Patent No.: US 8,804,367 B2
(45) Date of Patent: Aug. 12, 2014

(54) MULTILAYER CERAMIC CAPACITOR AND BOARD FOR MOUNTING THE SAME

(71) Applicant: Samsung Electro-Mechanics Co., Ltd., Gyunggi-do (KR)

(72) Inventors: Min Cheol Park, Gyunggi-do (KR); Sang Soo Park, Gyunggi-do (KR); Young Ghyu Ahn, Gyunggi-do (KR); Byoung Hwa Lee, Gyunggi-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 0 days.

(21) Appl. No.: 13/837,432

(22) Filed: Mar. 15, 2013

(65) Prior Publication Data

US 2014/0174806 A1 Jun. 26, 2014

(30) Foreign Application Priority Data

Dec. 20, 2012 (KR) .................. 10-2012-0149348

(51) Int. Cl.
*H05K 7/00* (2006.01)

(52) U.S. Cl.
USPC ........... 361/782; 362/782; 362/760; 362/811; 362/763

(58) Field of Classification Search
USPC .................. 361/782, 760, 811, 763
See application file for complete search history.

(56) References Cited

U.S. PATENT DOCUMENTS

| | | | |
|---|---|---|---|
| 6,292,353 B1 | 9/2001 | Haratani et al. | |
| 7,375,977 B2 * | 5/2008 | Maeda et al. | 361/763 |
| 7,613,007 B2 * | 11/2009 | Amey et al. | 361/763 |
| 2012/0152604 A1 | 6/2012 | Ahn et al. | |
| 2012/0300361 A1 | 11/2012 | Togashi | |

FOREIGN PATENT DOCUMENTS

| | | |
|---|---|---|
| JP | 6-215978 A | 8/1994 |
| JP | 07-183154 A | 7/1995 |
| JP | 10-097942 A | 4/1998 |
| JP | 2000-357624 A | 12/2000 |
| JP | 2002-305127 A | 10/2002 |
| JP | 2004-193352 A | 7/2004 |
| JP | 2004-228514 A | 8/2004 |
| JP | 2005-216955 A | 8/2005 |
| JP | 2012-216864 A | 11/2012 |
| JP | 2012-248581 A | 12/2012 |

OTHER PUBLICATIONS

Japanese Office Action, w/ English translation thereof, issued in Japanese Patent Application No. JP 2013-066030 dated Dec. 3, 2013.
Korean Notice of Office Action issued in Korean Application No. 10-2012-0149348 dated Feb. 13, 2014, w/English translation.

* cited by examiner

*Primary Examiner* — Andargie M Aychillhum
(74) *Attorney, Agent, or Firm* — McDermott Will & Emery LLP

(57) ABSTRACT

There is provided a multilayer ceramic capacitor including: a ceramic body; an active layer including a plurality of electrodes formed to be alternately exposed to both end surfaces of the ceramic body; an upper cover layer; a lower cover layer having a thickness greater than that of the upper cover layer; and external electrodes, wherein when a distance from an end portion of the lowermost internal electrode of the active layer to an end portion of the external electrode covering a portion of a lower surface of the ceramic body is E, the shortest distance from the end portion of the external electrode to the lowermost internal electrode of the active layer is T, and a margin of the ceramic body in the length direction is F, $1.2 \leq E/T$ and $30\ \mu m \leq F$ are satisfied.

13 Claims, 8 Drawing Sheets

US 8,804,367 B2

MULTILAYER CERAMIC CAPACITOR AND BOARD FOR MOUNTING THE SAME

CROSS-REFERENCE TO RELATED APPLICATIONS

This application claims the priority of Korean Patent Application No. 10-2012-149348 filed on Dec. 20, 2012, in the Korean Intellectual Property Office, the disclosure of which is incorporated herein by reference.

BACKGROUND OF THE INVENTION

1. Field of the Invention

The present invention relates to a multilayer ceramic capacitor and a board for mounting the same.

2. Description of the Related Art

A multilayer ceramic capacitor, a laminated chip electronic component, is a chip-type condenser installed on a printed circuit board (PCB) of various electronic products such as imaging devices (or video display apparatuses) like liquid crystal displays (LCDs), plasma display panels (PDPs), and the like, computers, personal digital assistants (PDAs), portable phones, and the like, to charge and discharge electricity.

A multilayer ceramic capacitor (MLCC), having advantages such as compactness, guaranteed high capacitance, and ease of mountability, may be used as a component of various electronic devices.

The MLCC may include a plurality of dielectric layers and internal electrodes, having a structure in which internal electrodes having different polarities are alternately laminated between the dielectric layers.

The dielectric layers have piezoelectric and electrostrictive properties. Thus, when a direct current (DC) or alternating current (AC) voltage is applied to an MLCC, a piezoelectric phenomenon occurs between internal electrodes, generating vibrations.

Vibrations may be transferred to a PCB on which the MLCC is mounted, through external electrodes of the MLCC, inducing the entirety of the PCB to become an acoustically radiating surface to generate vibratory sound as noise.

Vibratory sound may correspond to audio frequencies ranging from 20 Hz to 2000 Hz, making users uncomfortable, and such a vibrating sound, which may cause discomfort to users, is known as acoustic noise, and research into methods of reducing acoustic noise is required.

Also, in the MLCC, an internal electrode, smaller than a ceramic sheet and has a predetermined thickness, is printed on a ceramic sheet and the ceramic sheets respectively having an internal electrode printed thereon are laminated, inevitably generating steps between margin portions and the dielectric layers on which the internal electrodes are formed, and such steps may be severe in the outermost portions of the internal electrodes.

With the steps, if a thermal shock is applied or if stress resulting from warped printed circuit board (PCB) with the MLCC mounted thereon is applied, portions of the dielectric layers are delaminated or cracks may be generated.

Then, moisture and other foreign objects may infiltrate into an exposed surface of the internal electrodes due to the delamination or cracks, to degrade insulation resistance, reliability, or the like. This problem may be aggravated in a high capacity product having a large amount of laminated sheets.

Patent document 1 below relates to an MLCC in which a lower cover layer is thicker than an upper cover layer, but without disclosing a limitation in numerical values with respect to a distance between the outermost end portion of an internal electrode and an end portion of an external electrode.

RELATED ART DOCUMENT (Patent document 1) Japanese Patent Laid Open Publication No. 6-215978

SUMMARY OF THE INVENTION

In the related art, a novel scheme regarding a multilayer ceramic capacitor (MLCC), capable of restraining a generation of delamination or cracks due to a thermal shock or a mechanical shock such as stress generated due to a printed circuit board warped as an MLCC being mounted thereon, by compensating for steps between margin portions and dielectric layers on which internal electrodes are formed, while reducing noise caused by vibrations due to a piezoelectric phenomenon is required.

According to an aspect of the present invention, there is provided a multilayer ceramic capacitor including: a ceramic body in which a plurality of dielectric layers are laminated; an active layer including a plurality of internal electrodes formed to be alternately exposed to both end surfaces of the ceramic body with the dielectric layer interposed therebetween, and forming capacitance; an upper cover layer formed on an upper portion of the active layer; a lower cover layer formed on a lower portion of the active layer and having a thickness greater than that of the upper cover layer; and external electrodes covering both end surfaces and portions of upper and lower surfaces of the ceramic body, wherein when a distance from an end portion of the lowermost internal electrode of the active layer to an end portion of the external electrode covering a portion of a lower surface of the ceramic body is E, the shortest distance from the end portion of the external electrode to the lowermost internal electrode of the active layer is T, and a margin of the ceramic body in the length direction is F, $1.2 \leq E/T$ and $30 \mu m \leq F$ are satisfied.

When half of the overall thickness of the ceramic body is A, a thickness of the lower cover layer is B, half of the overall thickness of the active layer is C, a thickness of the upper cover layer is D, a ratio $(B+C)/A$ by which a central portion of the active layer deviates from a central portion of the ceramic body may satisfy $1.063 \leq (B+C)/A \leq 1.745$.

A ratio (D/B or D:B) between the thickness D of the upper cover layer and the thickness B of the lower cover layer may satisfy a range of $0.021 \leq D/B \leq 0.422$.

A ratio (B/A) of the thickness B of the lower cover layer to half A of the thickness of the ceramic body may satisfy a range of $0.329 \leq B/A \leq 1.522$.

A ratio (C/B) of the half of the thickness of the active layer C to the thickness B of the lower cover layer may satisfy a range of $0.146 \leq C/B \leq 2.458$.

Due to a difference between strain generated in the central portion of the active layer and that generated in the lower cover layer when a voltage is applied, a point of inflection (PI) formed at both end portions of the ceramic body may be formed below the central portion of the ceramic body in the thickness direction.

Portions of the first and second internal electrodes exposed to the end surfaces of the ceramic body may be tapered inwardly.

Corner portions of the other surfaces of the first and second internal electrodes, not exposed outwardly from the ceramic body, may be tapered inwardly.

According to another aspect of the present invention, there is provided a mounting board for allowing a multilayer ceramic capacitor (MLCC) to be mounted thereon, including: a printed circuit board having a pair of electrode pads formed on an upper portion thereof; and an MLCC installed on the PCB, wherein the MLCC includes a ceramic body in which a plurality of dielectric layers are laminated, an active layer including a plurality of internal electrodes formed to be alternately exposed to both end surfaces of the ceramic body with the dielectric layer interposed therebetween, and forming capacitance, an upper cover layer formed on an upper portion of the active layer, a lower cover layer formed on a lower portion of the active layer and having a thickness greater than that of the upper cover layer, and first and second external electrodes covering both end surfaces of the ceramic body and connected to the first and second electrode pads by solders, wherein when a distance from an end portion of the lowermost internal electrode of the active layer to an end portion of the external electrode covering a portion of a lower surface of the ceramic body is E, the shortest distance from the end portion of the external electrode to the lowermost internal electrode of the active layer is T, and a margin of the ceramic body in the length direction is F, $1.2 \leq E/T$ and $30\ \mu m \leq F$ are satisfied.

Due to a difference between strain generated in the central portion of the active layer and that generated in the lower cover layer when a voltage is applied, a point of inflection (PI) formed at both end portions of the ceramic body may be formed be lower than the height of the solders.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
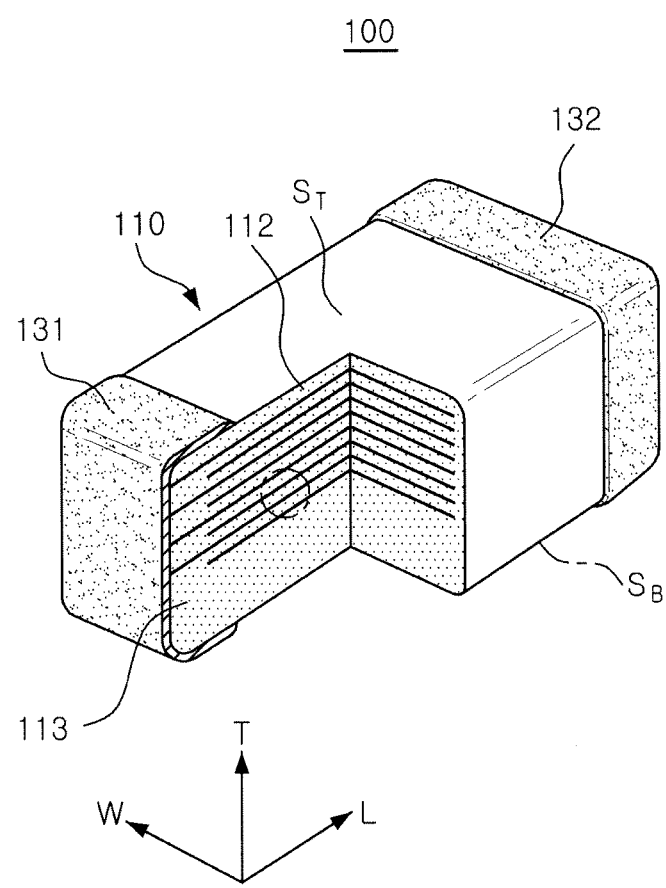
FIG. 1 is a partially cutaway schematic perspective view of a multilayer ceramic capacitor (MLCC) according to an embodiment of the present invention.

Embodiments of the present invention will now be described in detail with reference to the accompanying drawings.

The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like components.

Also, elements having the same function within a scope of the same concept illustrated in drawings of respective embodiments will be described by using the same reference numerals.

In order to clarify embodiments of the present invention, directions of the hexahedron may be defined as follows: L, W, and T indicated in FIG. 1 denote a length direction, a width direction, and a thickness direction, respectively. Here, the thickness direction may be used to have the same concept as that of a lamination direction in which the dielectric layers are laminated.

Also, in the present embodiment, for the purposes of description, surfaces on which first and second external electrodes are formed in a length direction of the ceramic body are set as horizontal end surfaces and surfaces perpendicular thereto are set as left and right lateral surfaces.

Multilayer Ceramic Capacitor (MLCC)

Figure 2:
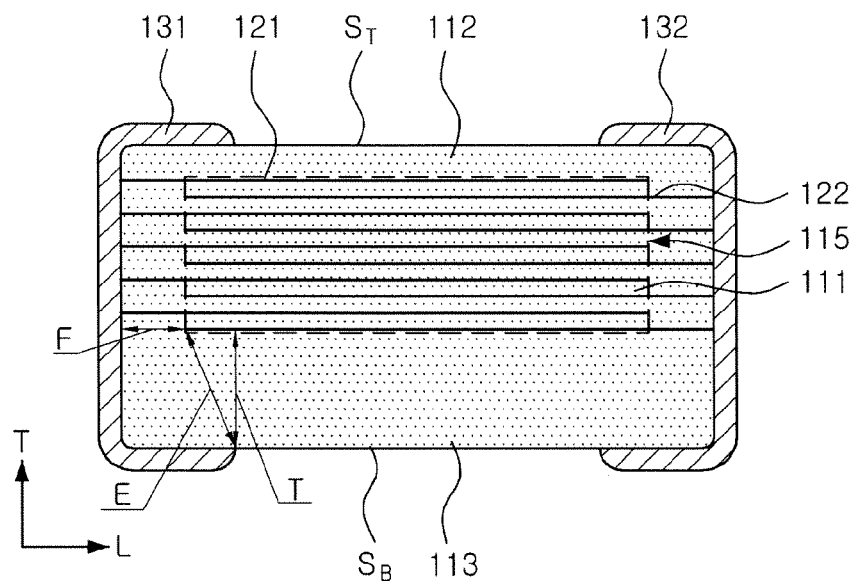
FIG. 2 is a cross-sectional view of the MLCC of FIG. 1 taken in a length direction of the MLCC.

Referring to FIGS. 1 through 2, an MLCC 100 according to an embodiment of the present invention may include a ceramic body 110, an active layer 115 having first and second internal electrodes 121 and 122, upper and lower cover layers 112 and 113, and first and second external electrodes 131 and 132 covering both end surfaces of the ceramic body 110.

The ceramic body 110 is formed by laminating a plurality of dielectric layers 111 and subsequently firing the same, and a configuration and dimensions of the ceramic body 110 and a lamination amount of the dielectric layers 111 are not limited to those illustrated in the present embodiment.

Also, the plurality of dielectric layers 111 forming the ceramic body 110 are in a sintered state and adjacent dielectric layers 50 may be integrated such that boundaries therebetween may not be readily apparent without the use of a scanning electron microscope (SEM).

The ceramic body 110 may include the active layer 115 as a portion of the capacitor contributing to the formation of capacitance, and upper and lower layers 112 and 113, as margin portions, formed on upper and lower portions of the active layer 115.

The active layer 115 may be formed by iteratively laminating the first and second internal electrodes 121 and 122 with the dielectric layer 115 interposed therebetween.

Here, a thickness of the dielectric layer 111 may be arbitrarily changed according to design of capacitance of the MLCC 100. Preferably, a thickness of one dielectric layer 111 may range from 0.1 μm to 10.0 μm after a firing operation, but the present invention is not limited thereto.

Also, the dielectric layer 111 may be made of ceramic powder having high dielectric constant (or high K-dielectrics), e.g., a barium titanate ($BaTiO_3$)-based powder, a strontium titanate ($SrTiO_3$)-based powder, or the like, but the present invention is not limited thereto.

The upper and lower cover layers 112 and 123 may be made of the same material and have the same configuration as those of the dielectric layer 111, except that they do not include an internal electrode.

The upper and lower cover layers 112 and 123 may be formed by laminating a single dielectric layer or two or more dielectric layers on upper and lower surfaces of the active layer 115, and basically serve to prevent damage to the first and second internal electrodes 121 and 122 due to physical or chemical stress.

Also, the lower cover layer 113 may have a thickness greater than that of the upper cover layer 112, by increasing a lamination amount of the dielectric layers to be greater than that of the upper cover layer 112.

Meanwhile, the first and second internal electrodes 121 and 122, a pair of electrodes having different polarities, may be formed by printing a conductive paste including a conductive metal (on ceramic green sheets) to have a predetermined thickness, such that the first and second internal electrodes 121 and 122 are alternately exposed to both end surfaces in a lamination direction of the dielectric layers 111, and may be electrically insulated from one another by the dielectric layer 111 disposed therebetween.

Namely, the first and second internal electrodes 121 and 122 may be electrically connected to the first and second external electrodes 131 and 132 through portions thereof alternately exposed to both end surfaces of the ceramic body 110.

Thus, when a voltage is applied to the first and second external electrodes 131 and 132, charges are accumulated between the mutually facing first and second internal electrodes 121 and 122 and, here, capacitance of the MLCC 100 is proportional to an area of a mutually overlap region of the first and second internal electrodes 121 and 122.

A thickness of the first and second internal electrodes may be determined according to purposes. For example, a thickness of the first and second internal electrodes may be determined to range from 0.2 μm to 1.0 μm, but the present invention is not limited thereto.

Also, a conductive metal included in the conductive paste forming the first and second internal electrodes 121 and 122 may be nickel (Ni), copper (Cu), palladium (Pd), or an alloy thereof, but the present invention is not limited thereto.

Also, the conductive paste may be printed by using a screening method, a gravure printing method, or the like, but the present invention is not limited thereto.

The first and second external electrodes 131 and 132 may be made of a conductive paste including a conductive metal and may cover both end surfaces and portions of upper and lower surfaces of the ceramic body 110, and the conductive metal may be nickel (Ni), copper (Cu), palladium (Pd), gold (Au), or alloys thereof, but the present invention is not limited thereto.

Here, steps are mainly generated between the first and second external electrodes 131 and 132 and end portions of the first and second internal electrodes 121 and 122 when the MLCC is mounted on a printed circuit board (PCB), so it is required to regulate a distance therebetween to reduce a generation of delamination and cracks to thus increase reliability.

In FIG. 2, it is defined that a distance from an end portion of the lowermost second internal electrode 122 of the active layer 115 to an end portion of the first external electrode 131 covering a portion of a lower surface of the ceramic body 110 is E, the shortest distance from the end portion of the first external electrode 131 to the lowermost second internal electrode 122 is T, and a margin from one end surface of the ceramic body 110 to an end portion of the second internal electrode 122 in the length direction is F.

Here, a range capable of increasing reliability by reducing a generation of delamination and cracks may be $1.2 \leq E/T$.

In case of $1.2 > E/T$, a portion on which mechanical shock such as stress due to a warped PCB is concentrated may be set to be consistent with or close to a portion of the ceramic body 110 in which steps are formed, increasing a warpage crack generation rate.

Also, the margin F of the ceramic body 110 in the length direction may be set to be equal to or greater than 30 μm in order to prevent a generation of delamination.

If the margin F of the ceramic body 100 in the length direction is less than 30 μm, a generation of delamination may be increased due to the insufficient margin.

Hereinafter, a relationship between constituent elements included in the MLCC according to the present embodiment and acoustic noise will be described.

Figure 3:
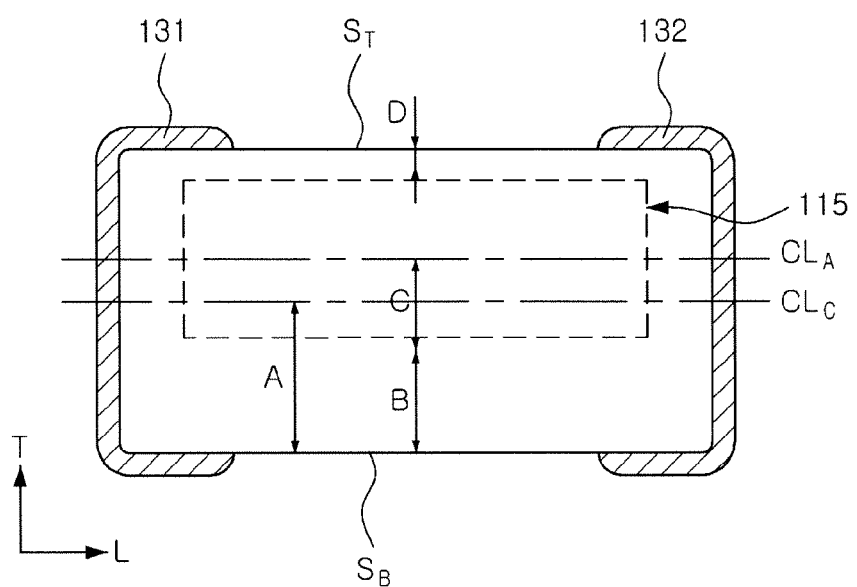
FIG. 3 is a schematic cross-sectional view of the MLCC of FIG. 1 taken in the length direction of the MLCC in the length direction to show dimensional relationships of components included in the MLCC.

Referring to FIG. 3, it is defined that half of the overall thickness of the ceramic body 110 is A, a thickness of the lower cover layer 113 is B, half of the overall thickness of the active layer 115 is C, and a thickness of the upper cover layer 112 is D.

Here, the overall thickness of the ceramic body 110 refers to a distance from the upper surface $S_T$ of the ceramic body 110 to the lower surface $S_B$ thereof, and the overall thickness of the active layer 115 refers to a distance from an upper surface of the first internal electrode 121 formed on the uppermost portion of the active layer 115 to a lower surface of the second internal electrode 122 formed on the lowermost portion of the active layer 115.

Also, the thickness B of the lower cover layer 113 refers to a distance from the lower surface of the second internal electrode 122 formed on the lowermost portion of the active layer 115 in the thickness direction to the lower surface $S_B$ of the ceramic body 110, and the thickness D of the upper cover layer 112 refers to a distance from the upper surface of the first internal electrode 121 formed on the uppermost of the active layer 115 in the thickness direction to the upper surface $S_T$ of the ceramic body 110.

When voltages having different polarities are applied to the first and second external electrodes 131 and 132 formed on both end portions of the MLCC 100, the ceramic body 110 expands and contracts in the thickness direction due to inverse piezoelectric effect of the dielectric layers 111, while the both end portions of the first and second external electrodes 131 and 132 contract and expand due to a Poisson effect, contrary to the expansion and contraction of the ceramic body 110 in the thickness direction.

Here, the central portion of the active layer 115 is a portion which is maximally expanded and contracted in both end portions of the ceramic body 110 in the length direction of the first and second external electrodes 131 and 132, which causes acoustic noise.

Namely, in the present embodiment, in order to reduce acoustic noise, due to a difference between strain generated in the central portion $CL_A$ of the active layer 150 and that generated in the lower cover layer 113 as a voltage is applied, a point of inflection (PI) may be formed at both end portions of the ceramic body 110 below the central portion $CL_C$ of the ceramic body 110 in the thickness direction.

Here, in order to further reduce acoustic noise, preferably, the ratio ((B+C):A) by which the central portion $CL_A$ of the active layer 115 deviates from the central portion of the ceramic body 110 satisfies the range $1.063 \leq (B+C)/A \leq 1.745$.

Also, the ratio (B:A) (or B/A) between half (A) of the thickness D of the ceramic body 110 and the thickness B of the lower cover layer 113 may satisfy the range $0.329 \leq B/A \leq 1.522$.

Also, the ratio (C:B) between the thickness B of the lower cover layer 113 and the half (C) of the thickness of the active layer 115 may satisfy the range $0.146 \leq C/B \leq 2.458$.

Experimental Example

Multilayer ceramic capacitors (MLCC) according to embodiments of the present invention and comparative examples were fabricated as follows.

The MLCCs according to the Examples were manufactured through the following steps.

First, a slurry including powder such as barium titanate ($BaTiO_3$), or the like, was applied to a carrier film and then dried to prepare a plurality of ceramic green sheets having a thickness of 1.8 μm.

Next, internal electrodes were formed by applying a conductive paste for a nickel internal electrode on the ceramic green sheets by using a screen.

About three hundreds and seventy (370) ceramic green sheets were laminated, and here, a larger number of ceramic green sheets without an internal electrode were laminated below ceramic green sheets with an internal electrode formed thereon than those above the ceramic green sheets with an internal electrode formed thereon. The laminate (or lamination body) was isostatic-pressed under a pressure condition of 1000 kgf/cm² at 85° C. The pressing-completed ceramic laminate was severed into individual chips, and a debinding process was performed by maintaining the severed chips at 230° C. for 60 hours under air atmosphere.

Thereafter, the chips were fired at an oxygen partial pressure of $10^{-11}$ atm ~$10^{-10}$ atm, lower than a Ni/NiO equilibrium oxygen partial pressure, under a reduced atmosphere such that the internal electrodes were not oxidized. After the firing operation, a chip size (length×width (L×W)) of a laminated chip capacitor was 1.64 mm×0.88 mm (L×W, 1608 size). Here, a fabrication tolerance was determined to be ±0.1 mm in length×width, and acoustic noise of a chip satisfying the fabrication tolerance was measured in experimentation.

Thereafter, the chip was subjected to processes such as an external electrode formation process, a plating process, and the like, to fabricate an MLCC.

TABLE 1

| sample | A (μm) | B (μm) | C (μm) | D (μm) | (B + C)/A | B/A | D/B | C/B | AN (dB) | Capacitance implementation rate |
|---|---|---|---|---|---|---|---|---|---|---|
| 1* | 405.5 | 40.2 | 365.4 | 39.9 | 1.000 | 0.099 | 0.993 | 9.090 | 29.5 | OK |
| 2* | 436.0 | 70.4 | 365.9 | 69.7 | 1.001 | 1.161 | 0.990 | 5.197 | 25.7 | OK |
| 3* | 455.5 | 90.8 | 364.3 | 91.5 | 0.999 | 0.199 | 1.008 | 4.012 | 23.1 | OK |
| 4* | 508.1 | 24.9 | 361.1 | 269.1 | 0.760 | 0.049 | 10.807 | 14.502 | 31.2 | OK |
| 5* | 456.6 | 25.2 | 360.1 | 167.8 | 0.844 | 0.055 | 6.659 | 14.290 | 32.5 | OK |
| 6* | 527.3 | 30.2 | 191.0 | 642.4 | 0.419 | 0.057 | 21.272 | 6.325 | 30.3 | OK |
| 7* | 414.5 | 30.9 | 188.8 | 420.4 | 0.530 | 0.075 | 13.605 | 6.110 | 30.5 | OK |
| 8* | 516.2 | 39.4 | 360.7 | 271.5 | 0.775 | 0.076 | 6.891 | 9.155 | 28.2 | OK |
| 9* | 446.0 | 39.8 | 365.5 | 121.2 | 0.909 | 0.089 | 3.045 | 9.183 | 29.1 | OK |
| 10* | 469.1 | 40.6 | 364.2 | 169.1 | 0.863 | 0.087 | 4.165 | 8.970 | 27.9 | OK |
| 11* | 416.2 | 40.7 | 360.7 | 70.3 | 0.964 | 0.098 | 1.727 | 8.862 | 28.4 | OK |
| 12* | 428.3 | 40.8 | 360.0 | 95.7 | 0.936 | 0.095 | 2.346 | 8.824 | 28.9 | OK |
| 13* | 495.9 | 40.9 | 364.9 | 221.0 | 0.818 | 0.082 | 5.403 | 8.922 | 28.1 | OK |
| 14* | 435.9 | 25.0 | 421.3 | 4.2 | 1.024 | 0.057 | 0.168 | 16.852 | 31.6 | OK |
| 15* | 420.7 | 70.4 | 365.9 | 39.1 | 1.037 | 0.167 | 0.555 | 5.197 | 25.7 | OK |
| 16 | 431.7 | 94.8 | 364.3 | 40.0 | 1.063 | 0.220 | 0.422 | 3.843 | 19.9 | OK |
| 17 | 443.0 | 103.8 | 389.1 | 4.0 | 1.113 | 0.234 | 0.039 | 3.749 | 19.3 | OK |
| 18 | 443.7 | 119.8 | 363.2 | 41.1 | 1.089 | 0.270 | 0.343 | 3.032 | 18.7 | OK |
| 19 | 447.1 | 147.3 | 362.1 | 22.7 | 1.139 | 0.329 | 0.154 | 2.458 | 17.9 | OK |
| 20 | 452.8 | 164.7 | 360.2 | 20.4 | 1.159 | 0.364 | 0.124 | 2.187 | 17.3 | OK |
| 21 | 448.7 | 170.3 | 361.0 | 5.1 | 1.184 | 0.380 | 0.030 | 2.120 | 17.2 | OK |
| 22 | 470.7 | 170.3 | 365.4 | 40.2 | 1.138 | 0.362 | 0.236 | 2.144 | 17.4 | OK |
| 23 | 491.9 | 220.3 | 360.8 | 41.8 | 1.181 | 0.448 | 0.190 | 1.638 | 16.9 | OK |
| 24 | 500.6 | 270.2 | 360.5 | 9.9 | 1.260 | 0.540 | 0.037 | 1.334 | 16.8 | OK |
| 25 | 516.9 | 270.4 | 361.8 | 39.7 | 1.223 | 0.523 | 0.147 | 1.338 | 16.7 | OK |
| 26 | 502.1 | 364.9 | 312.3 | 14.7 | 1.349 | 0.727 | 0.040 | 0.856 | 16.6 | OK |
| 27 | 407.5 | 421.8 | 189.1 | 14.9 | 1.499 | 1.035 | 0.035 | 0.448 | 16.6 | OK |
| 28 | 445.8 | 493.3 | 179.3 | 39.7 | 1.509 | 1.107 | 0.080 | 0.363 | 16.5 | OK |
| 29 | 483.7 | 632.0 | 160.1 | 15.2 | 1.638 | 1.307 | 0.024 | 0.253 | 16.4 | OK |
| 30 | 520.0 | 643.4 | 190.7 | 15.2 | 1.604 | 1.237 | 0.024 | 0.296 | 16.4 | OK |
| 31 | 486.4 | 685.3 | 121.1 | 45.3 | 1.658 | 1.409 | 0.066 | 0.177 | 16.4 | OK |
| 32 | 507.2 | 742.7 | 120.8 | 30.1 | 1.702 | 1.464 | 0.041 | 0.163 | 16.4 | OK |
| 33 | 515.2 | 773.9 | 118.2 | 20.1 | 1.732 | 1.502 | 0.026 | 0.153 | 16.4 | OK |
| 34 | 524.5 | 798.2 | 116.9 | 16.9 | 1.745 | 1.522 | 0.021 | 0.146 | 16.3 | OK |
| 35* | 533.4 | 832.4 | 109.8 | 14.8 | 1.766 | 1.561 | 0.018 | 0.132 | 16.3 | NG |
| 36* | 533.3 | 841.1 | 105.3 | 14.9 | 1.775 | 1.577 | 0.018 | 0.125 | 16.3 | NG |
| 37* | 534.1 | 849.7 | 101.2 | 16.1 | 1.780 | 1.591 | 0.019 | 0.119 | 16.3 | NG |

*indicates comparative example, and AN is acoustic noise

Data in Table 1 was obtained by measuring dimensions of a section of the central portion of the ceramic body 110 of the MLCC 100 taken in the length direction (L) and the thickness direction (T) from the central portion of the ceramic body 110 in the width (W) direction as shown in FIG. 3, based on images taken by a scanning electron microscope (SEM).

Here, as described above, A was defined as half of the overall thickness of the ceramic body 110, B was defined as a thickness of the lower cover layer 113, C was defined as half of the overall thickness of the active layer 115, and D was defined as a thickness of the upper cover layer 112.

In order to measure acoustic noise, a single sample (MLCC) per board for measuring acoustic noise was discriminated in a vertical direction and mounted on a PCB, and then, the board was mounted in a measurement jig.

Thereafter, a DC voltage and varied voltages were applied to both terminals of the sample mounted in the measurement jig by using a power DC power supply and a signal generator (or a function generator). Acoustic noise was measured through a microphone installed directly above the PCB.

In Table 1, samples 1 to 3 are comparative examples having a cover-symmetrical structure in which the thickness B of the lower cover layer 113 and the thickness D of the upper cover layer D were substantially similar, and samples 4 to 13 are comparative examples having a structure in which the thickness D of the upper cover layer 112 was greater than the thickness B of the lower cover layer.

Samples 14, 15, and 35 to 37 are comparative examples having a structure in which the thickness B of the lower cover layer 113 was greater than the thickness D of the upper cover layer 112, and samples 16 to 34 were embodiments of the present invention.

Here, when (B+C)/A was nearly 1, it means that the central portion of the active layer 115 does not greatly deviate from the central portion of the ceramic body 110. The (B+C)/A value of samples 1 to 3 having a cover-symmetrical structure in which the thickness B of the lower cover layer 113 and the thickness D of the upper cover layer 112 were substantially similar is nearly 1.

When (B+C)/A was greater than 1, it may mean that the central portion of the active layer 115 deviated from the central portion of the ceramic body 110 in an upward direction, and when (B+C)/A was smaller than 1, it may mean that the central portion of the active layer 115 deviated from the central portion of the ceramic body 110 in a downward direction.

Referring to Table 1, it can be seen that, in samples 16 to 34 in which the ratio (B+C)/A by which the central portion of the active layer 115 deviated from the central portion of the ceramic body 110 satisfied the range 1.063≤(B+C)/A≤1.745, acoustic noise was significantly reduced to less than 20 dB.

Also, samples 1 to 15 in which the ratio (B+C)/A by which the central portion of the active layer 115 deviated from the central portion of the ceramic body 110 was less than 1.063, had a structure in which the central portion of the active layer 115 scarcely deviated from the central portion of the ceramic body 110 or the central portion of the active layer 115 deviated from the central portion of the ceramic body 110 in a downward direction.

Samples 1 to 15 having (B+C)/A less than 1.063 have acoustic noise ranging from 25 dB to 32.5 dB, so it can be seen that samples 1 to 15 did not have an acoustic noise reduction effect in comparison to the embodiment of the present invention.

Also, in the case of samples 35 to 37 in which the ratio (B+C)/A by which the central portion of the active layer 115 deviated from the central portion of the ceramic body 110 exceeds 1.745, capacitance was lower than a target value, causing defective capacitance.

In Table 1, capacitance implementation rate (i.e., a ratio of capacitance to target capacitance value) indicated as 'NG' means that when a target capacitance value is 100%, a capacitance value against the target capacitance value is less than 80%.

Also, it can be seen that embodiments in which the ratio (D:B) between the thickness D of the upper cover layer 112 and the thickness B of the lower cover layer 113 satisfied the range 0.021≤D/B≤0.422 had considerably reduced acoustic noise.

Meanwhile, it can be seen that comparative examples in which the ratio (D:B) between the thickness D of the upper cover 112 and the thickness B of the lower cover layer 113 exceeded 0.422 had no effect of reducing acoustic noise.

If the ratio (D/B) between the thickness D of the upper cover layer 112 and the thickness B of the lower cover layer 113 is less than 0.021, the thickness B of the lower cover layer 113 is excessively great relative to the thickness D of the upper cover layer 112, potentially generating cracks and delamination and defective capacitance due to low capacitance in comparison to a target capacitance.

Among the embodiments, it can be seen that, in the samples 19 to 34 in which the ratio (B/A) of the thickness B of the lower cover layer 113 to the thickness A of the ceramic body 110 and the ratio (C/B) of the thickness C of the active layer 115 to the thickness B of the lower cover layer 113 satisfied the ranges of 0.329≤B/A≤1.522 and 0.146≤C/B≤2.458, respectively, acoustic noise was further reduced to less than 18 dB.

Meanwhile, it can be seen that, in the samples 35 to 37 in which the ratio (B/A) of the thickness B of the lower cover layer 113 to the thickness A of the ceramic body 110 exceeded 1.522 or the ratio (C/B) of the thickness C of the active layer 115 to the thickness B of the lower cover layer 113 was less than 0.146, capacitance in comparison to the target capacitance was so low as to generate defective capacitance.

Table 2 below shows the generation of warpage cracks and delamination in the MLCC 100, according to a ratio between the distance E from the end portion of the lowermost internal electrode of the active layer 115 to the end portion of the external electrode covering a portion of a lower surface of the ceramic body 110 and the shortest distance T from the end portion of the external electrode to the lowermost internal electrode of the active layer 115, and the margin F of the ceramic body 110 in the length direction. As for numerical values of warpage cracks and delamination in Table 2, 50 samples in each case were tested and numbers of defective samples were indicated.

TABLE 2

| No. | T | F | E | E/T | Warpage cracks | delamination |
|---|---|---|---|---|---|---|
| 1 | 220 | 10 | 364.0 | 1.655 | 0 | 11 |
| 2 | 220 | 20 | 356.1 | 1.619 | 0 | 4 |
| 3 | 220 | 30 | 348.3 | 1.583 | 0 | 0 |
| 4 | 220 | 40 | 340.6 | 1.548 | 0 | 0 |
| 5 | 220 | 50 | 333.0 | 1.514 | 0 | 0 |
| 6 | 220 | 75 | 314.7 | 1.430 | 0 | 0 |
| 7 | 220 | 100 | 297.3 | 1.351 | 0 | 0 |
| 8 | 220 | 125 | 281.1 | 1.278 | 0 | 0 |
| 9 | 220 | 150 | 266.3 | 1.210 | 0 | 0 |
| 10* | 220 | 175 | 253.0 | 1.150 | 1 | 0 |
| 11* | 220 | 200 | 241.7 | 1.098 | 3 | 0 |
| 12* | 220 | 225 | 232.4 | 1.057 | 5 | 0 |
| 13* | 220 | 250 | 225.6 | 1.026 | 10 | 0 |
| 14* | 160 | 10 | 331.2 | 2.070 | 0 | 13 |
| 15* | 160 | 20 | 322.5 | 2.016 | 0 | 3 |
| 16 | 160 | 30 | 313.9 | 1.962 | 0 | 0 |
| 17 | 160 | 40 | 305.3 | 1.908 | 0 | 0 |
| 18 | 160 | 50 | 296.8 | 1.855 | 0 | 0 |
| 19 | 160 | 75 | 276.1 | 1.726 | 0 | 0 |
| 20 | 160 | 100 | 256.1 | 1.601 | 0 | 0 |
| 21 | 160 | 125 | 237.1 | 1.482 | 0 | 0 |
| 22 | 160 | 150 | 219.3 | 1.371 | 0 | 0 |
| 23 | 160 | 175 | 203.0 | 1.269 | 0 | 0 |
| 24* | 160 | 200 | 188.7 | 1.179 | 2 | 0 |
| 25* | 160 | 225 | 176.7 | 1.104 | 5 | 0 |
| 26* | 170 | 250 | 177.2 | 1.042 | 7 | 0 |

*indicates comparative example, and unit of T, E, and F is μm

Referring to Table 2, in the case of samples 10 to 13 and samples 24 to 26 as comparative examples in which a ratio (E/T) between the distance E from the end portion of the lowermost internal electrode of the active layer 115 to the end portion of the external electrode covering a portion of a lower surface of the ceramic body 110 and the shortest distance T from the end portion of the external electrode to the lowermost internal electrode of the active layer 115 was less than 1.2, it can be seen that, the portion on which stress due to the warped PCB was concentrated was consistent with or close to the portion of the ceramic body 110 in which steps were formed, generating warpage cracks.

Also, in case of samples 1, 2, 14, and 15 as comparative examples in which the ratio E/T was equal to or more than 1.2 but the margin F of the ceramic body 110 in the length direction was less than 30 μm, it can be seen that, warpage cracks were not generated but delamination occurred.

Thus, it can be seen from the test that, in order to avoid a generation of warpage cracks and delamination, a desirable ratio (E/T) between the distance E from the end portion of the lowermost internal electrode of the active layer 115 to the end portion of the external electrode covering a portion of a lower surface of the ceramic body 110 and the shortest distance T from the end portion of the external electrode to the lowermost internal electrode of the active layer 115 was equal to or more than 1.2 and a desirable margin F of the ceramic body 110 in the length direction was equal to or more than 30 μm.

Circuit Board with MLCC Mounted Thereon

Figure 4:
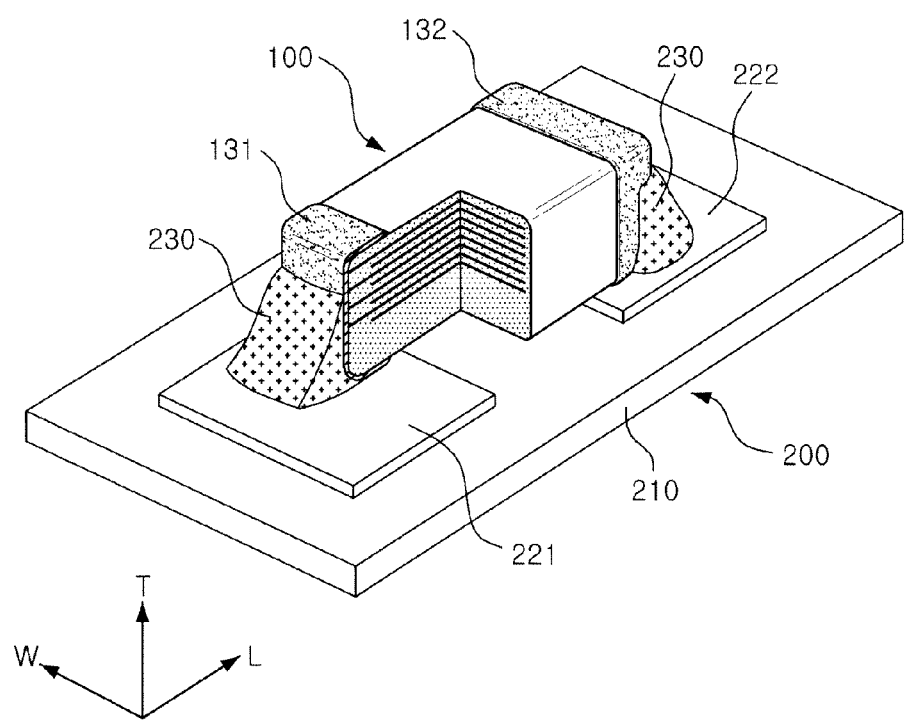
FIG. 4 is a perspective view illustrating the MLCC of FIG. 1 mounted on a printed circuit board (PCB)
Figure 5:
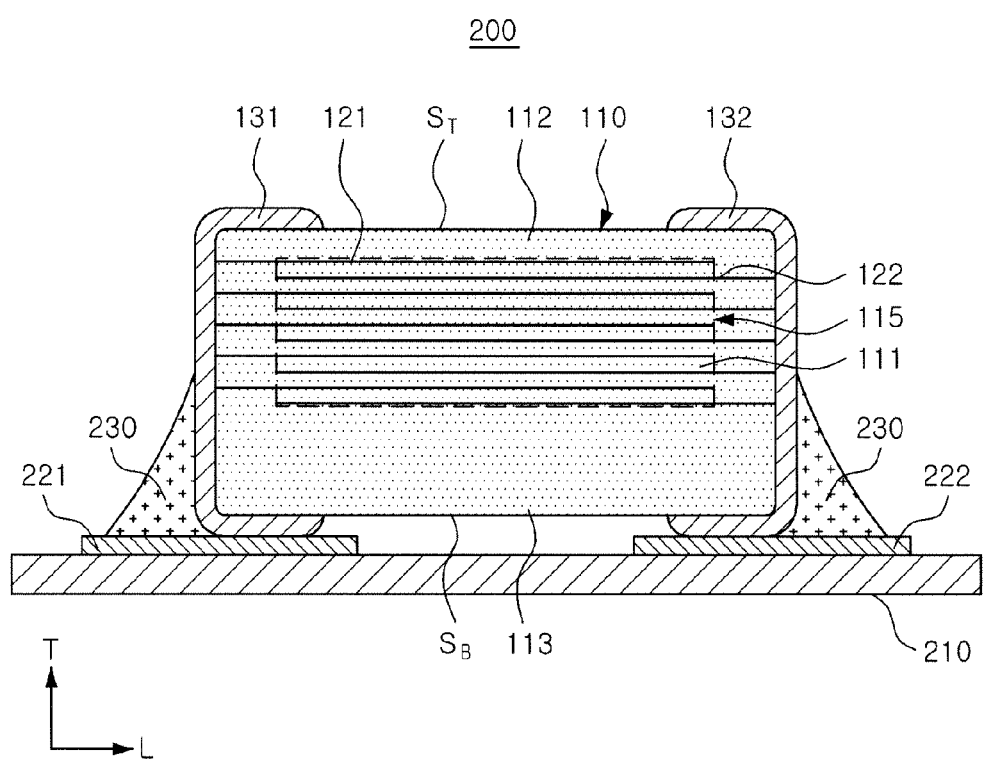
FIG. 5 is a cross-sectional view of the MLCC and PCB of FIG. 4 taken in the length direction.

Referring to FIGS. 4 and 5, a mounting board 200 of the MLCC 100 according to the present embodiment may include a PCB 210 on which the MLCC 10 is horizontally mounted and first and second electrode pads 221 and 222 formed to be spaced apart from one another on an upper surface of the PCB 210.

Here, in a state that the lower cover layer 113 of the MLCC 100 is disposed at the bottom and the first and second external electrodes 131 and 132 are in contact with the first and second electrode pads 221 and 222 on the first and second electrodes 221 and 222, the MLCC 100 may be electrically connected to the PCB 210 by solders 230.

In the state that the MLCC 100 is mounted on the PCB 210, when a voltage is applied, acoustic noise may be generated.

Here, the size of the first and second electrode pads 221 and 222 may be an indicator for determining an amount of the solder 230 connecting the first and second external electrodes 131 and 132 and the first and second electrode pads 221 and 222, and a magnitude of acoustic noise may be regulated according to an amount of the solder 230.

Figure 6:
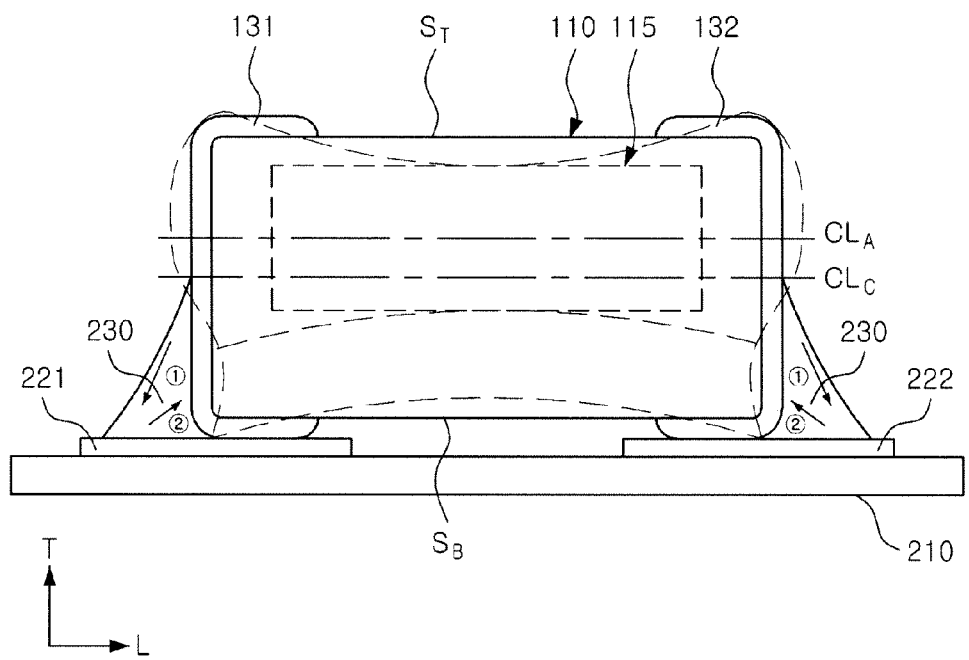
FIG. 6 is a schematic cross-sectional view illustrating the MLCC of FIG. 5 mounted on the PCB, deformed as voltage is applied thereto.

Referring to FIG. 6, with the MLCC 100 mounted on the PCB 210, when voltages having different polarities are applied to the first and second external electrodes 131 and 132 formed on both end portions of the MLCC 100, the ceramic body 110 expands and contracts in the thickness direction due to an inverse piezoelectric effect of the dielectric layers 111, while the both end portions of the first and second external electrodes 131 and 132 contract and expand due to a Poisson effect, contrary to the expansion and contraction of the ceramic body 110 in the thickness direction.

Here, the central portion of the active layer 115 is a portion maximally expanded and contracted in both end portions of the first and second external electrodes 131 and 132 in the length direction, causing acoustic noise.

When both end portions of the MLCC 100 in the length direction are maximally expanded, force ① thrusting upper portions of the solder 230 outwardly due to the expansion is generated, and contracting force ② thrusting the external electrodes is generated at the lower portions of the solder 230 by the force thrust to the outside.

Thus, as in the present embodiment, when the point of inflection (PI) formed at both end portions of the ceramic body is formed to be lower than the height of the solders due to a difference between strain generated in the central portion $CL_A$ of the active layer 115 and that generated in the lower cover layer 113 as a voltage is applied, acoustic noise can be further reduced.

Modification of Internal Electrodes

Meanwhile, conductive foreign objects, moisture, impurities such as ions, or the like, may infiltrate through a corner portion formed thinner than the central portion on the surface on which the internal electrodes are exposed, degrading insulation resistance and reliability.

In order to solve the problem, a bottleneck type internal electrode having a bottleneck pattern may be used, and the present embodiment may be applicable to a case of using a bottleneck type internal electrode.

FIGS. 7 through 13 are cross-sectional views illustrating various modifications of internal electrodes applied to an MLCC according to an embodiment of the present invention.

Figure 7:
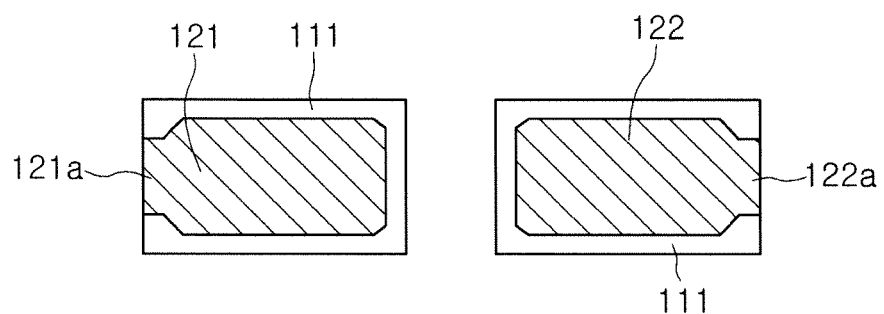
FIGS. 7 through 13 are cross-sectional views illustrating various modifications of internal electrodes applied to an MLCC according to an embodiment of the present invention.

Referring to FIG. 7, the first and second internal electrodes 121 and 122 may have first and second lead out portions 121a and 122a extending to be alternately exposed to one end surface of the dielectric layer 111, respectively, and here, corner portions in which the first and second lead out portions 121a and 122a and the first and second internal electrodes 121 and 122 are respectively connected may have sloped surfaces so as to be tapered inwardly, respectively.

Figure 8:
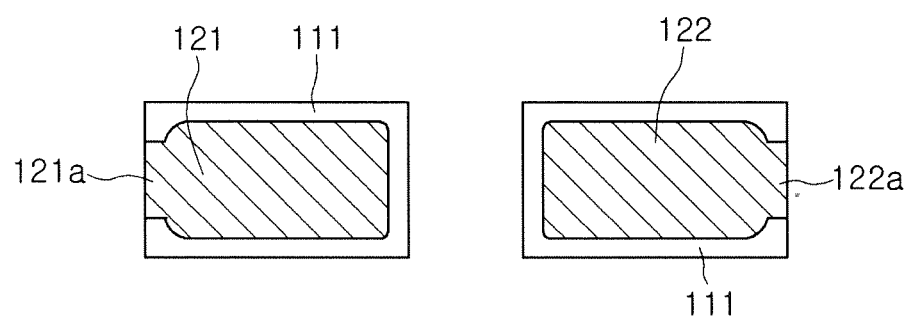

Also, as illustrated in FIG. 8, the corner portions connecting the first and second lead out portions 121a and 122a and the first and second internal electrodes 121 and 122 may have curved surfaces, respectively.

Figure 9:
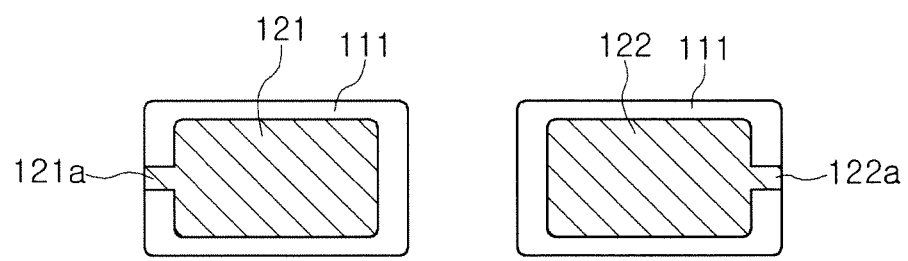

Also, as illustrated in FIG. 9, a width of the first and second lead out portions 121a and 122a may be variously reduced or increased, and an area of a margin portion of the dielectric layer 111 in the length direction may be determined to be inversely proportional to a width of the first and second lead out portions 121a and 122a.

Figure 10:
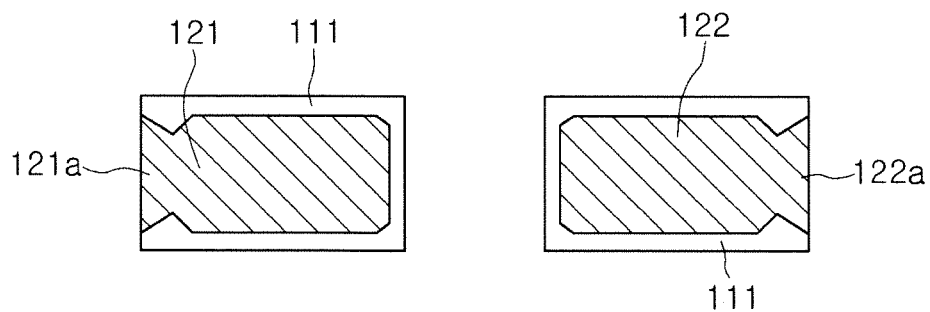

Meanwhile, referring to FIG. 10, the corner portions connecting the first and second lead out portions 121a and 122a and the first and second internal electrodes 121 and 122 are formed as recess portions to secure a larger area of the margin portion in the corner portions of dielectric layer 111, to thus reduce a generation of warpage cracks and delamination.

Figure 11:
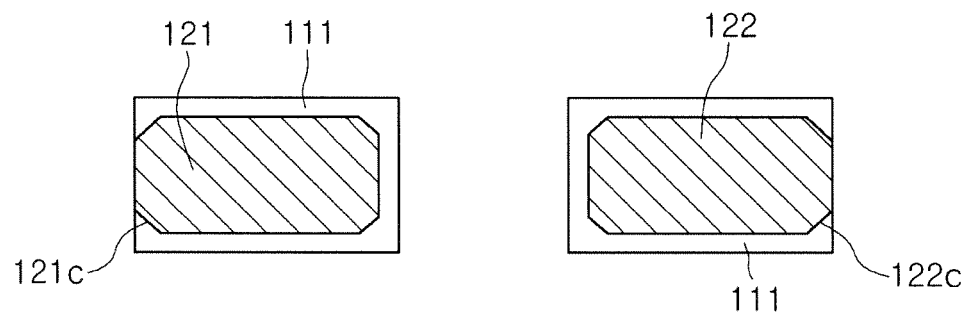

As illustrated in FIG. 11, rather than forming lead out portions, both corner portions 121c and 122c of the front end surface of the first and second internal electrodes 121 and 122 exposed to one end surface of the dielectric layer 111 may be sloped so as to be tapered inwardly.

Figure 12:
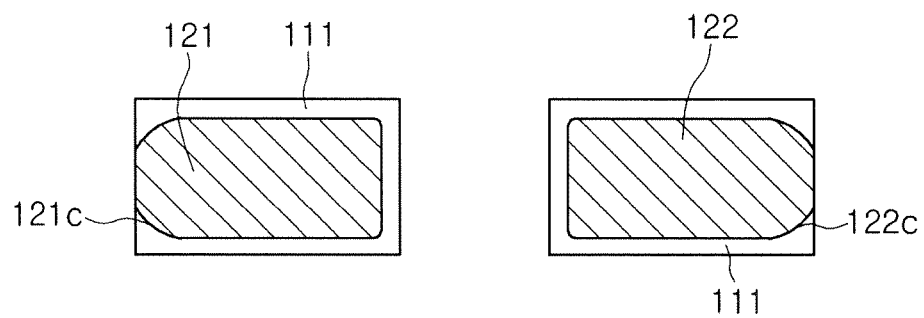

Here, as illustrated in FIG. 12, the corner portions 121c and 122c of the first and second internal electrodes 121 and 122 may also be formed to be curved.

Figure 13:
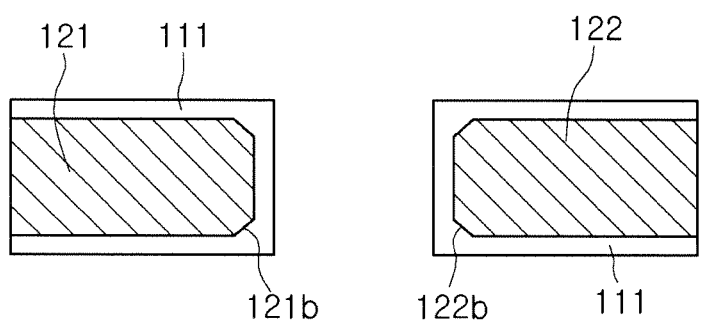

Meanwhile, as illustrated in FIG. 13, corner portions 121b and 122b of the other surfaces of the first and second internal electrodes 121 and 122, which are not exposed, may be formed to be tapered and sloped.

Here, in order to minimize a generation of delamination, preferably, the longest length of the margin portion with respect to a front end surface of the dielectric layer 111 based on a starting point and an ending point of the corner portions 121b and 122b is approximately twice the shortest length.

As set forth above, according to embodiments of the present invention, vibrations generated in the MLCC are reduced to reduce acoustic noise generated by a printed circuit board (PCB), and steps in the ceramic body are compensated for to restrain a generation of delamination or cracks due to thermal shock or mechanical shock such as stress generated due to the printed circuit board warped as the MLCC is mounted thereon, whereby moisture or foreign objects are prevented from infiltrating into an exposed surface of an internal electrode, thus preventing degradation of insulation resistance and enhancing reliability of the MLCC.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor comprising:
a ceramic body in which a plurality of dielectric layers are laminated;
an active layer including a plurality of internal electrodes formed to be alternately exposed to both end surfaces of the ceramic body with the dielectric layer interposed therebetween, and forming capacitance;
an upper cover layer formed on an upper portion of the active layer;
a lower cover layer formed on a lower portion of the active layer and having a thickness greater than that of the upper cover layer; and
external electrodes covering both end surfaces and portions of upper and lower surfaces of the ceramic body,
wherein when a distance from an end portion of a lowermost internal electrode of the active layer to an end portion of the external electrode covering a portion of a lower surface of the ceramic body is E, the shortest distance from the end portion of the external electrode to the lowermost internal electrode of the active layer is T, and a margin of the ceramic body in the length direction is F, $1.2 \leq E/T$ and $30 \, \mu m \leq F$ are satisfied.

2. The multilayer ceramic capacitor of claim 1, wherein when the thickness of the lower cover layer is B and the thickness of the upper cover layer is D, a ratio (D/B) between the thickness D of the upper cover layer and the thickness B of the lower cover layer satisfies a range of $0.021 \leq D/B \leq 0.422$.

3. The multilayer ceramic capacitor of claim 1, wherein when half of the overall thickness of the ceramic body is A and the thickness of the lower cover layer is B,
a ratio (B/A) of the thickness B of the lower cover layer to half A of the thickness of the ceramic body satisfies a range of $0.329 \leq B/A \leq 1.522$.

4. The multilayer ceramic capacitor of claim 1, wherein when the thickness of the lower cover layer is B and half of the overall thickness of the active layer is C,
a ratio (C/B) of the half of the thickness of the active layer C to the thickness B of the lower cover layer satisfies a range of $0.146 \leq C/B \leq 2.458$.

5. The multilayer ceramic capacitor of claim 1, wherein due to a difference between strain generated in the central portion of the active layer and that generated in the lower cover layer when a voltage is applied, a point of inflection (PI) formed at both end portions of the ceramic body is formed below the central portion of the ceramic body in the thickness direction.

6. The multilayer ceramic capacitor of claim 1, wherein portions of the first and second internal electrodes exposed to the end surfaces of the ceramic body are tapered inwardly.

7. The multilayer ceramic capacitor of claim 1, wherein corner portions of the other surfaces of the first and second internal electrodes, which are not exposed outwardly from the ceramic body, are tapered inwardly.

8. A mounting board for allowing a multilayer ceramic capacitor (MLCC) to be mounted thereon, the mounting board comprising:
a printed circuit board having a pair of electrode pads formed on an upper portion thereof; and
an MLCC installed on the PCB,
wherein the MLCC comprises a ceramic body in which a plurality of dielectric layers are laminated, an active layer including a plurality of internal electrodes formed to be alternately exposed to both end surfaces of the ceramic body with the dielectric layer interposed therebetween, and forming capacitance, an upper cover layer formed on an upper portion of the active layer, a lower cover layer formed on a lower portion of the active layer and having a thickness greater than that of the upper cover layer, external electrodes covering both end surfaces of the ceramic body and connected to the first and second electrode pads by solders, wherein when a distance from an end portion of a lowermost internal electrode of the active layer to an end portion of the external electrode covering a portion of a lower surface of the ceramic body is E, the shortest distance from the end portion of the external electrode to the lowermost internal electrode of the active layer is T, and a margin of the ceramic body in the length direction is F, $1.2 \leq E/T$ and $30 \, \mu m \leq F$ are satisfied.

9. The mounting board of claim 8, wherein when half of the overall thickness of the ceramic body is A, a thickness of the lower cover layer is B, half of the overall thickness of the active layer is C, a thickness of the upper cover layer is D,
a ratio (B+C)/A by which a central portion of the active layer deviates from a central portion of the ceramic body satisfies $1.063 \leq (B+C)/A \leq 1.745$.

10. The mounting board of claim 8, wherein a ratio (D/B or D:B) between the thickness D of the upper cover layer and the thickness B of the lower cover layer satisfies a range of $0.021 \leq D/B \leq 0.422$.

11. The mounting board of claim 8, wherein a ratio (B/A) of the thickness B of the lower cover layer to half A of the thickness of the ceramic body satisfies a range of $0.329 \leq B/A \leq 1.522$.

12. The mounting board of claim 8, wherein a ratio (C/B) of the half of the thickness of the active layer C to the thickness B of the lower cover layer satisfies a range of $0.146 \leq C/B \leq 2.458$.

13. The mounting board of claim 8, wherein due to a difference between strain generated in the central portion of the active layer and that generated in the lower cover layer when a voltage is applied, a point of inflection (PI) formed at both end portions of the ceramic body is formed below the central portion of the ceramic body in the thickness direction.

* * * * *